US008615054B2

(12) United States Patent
Cohen (10) Patent No.: US 8,615,054 B2
(45) Date of Patent: Dec. 24, 2013

(54) CLOSE-LOOP POWER AMPLIFIER PRE-DISTORTION CORRECTION (75) Inventor: Emanuel Cohen, Haifa (IL)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 12/924,304

(22) Filed: Sep. 24, 2010

(65) Prior Publication Data

US 2012/0076237 A1 Mar. 29, 2012

(51) Int. Cl.
H04L 25/03 (2006.01)

(52) U.S. Cl.
USPC .......................................................... 375/297

(58) Field of Classification Search
None
See application file for complete search history.

(56) References Cited

U.S. PATENT DOCUMENTS

| 6,429,736 | B1 * | 8/2002 | Parry et al. .................... 330/2 |
| 7,492,223 | B2 * | 2/2009 | Behzad et al. ................ 330/136 |
| 7,514,996 | B2 * | 4/2009 | Furuta et al. .................. 330/149 |
| 7,565,119 | B2 | 7/2009 | Cohen |
| 7,679,449 | B2 * | 3/2010 | Behzad et al. ................ 330/285 |
| 8,175,553 | B2 * | 5/2012 | Ben-Ayun et al. ........... 455/126 |
| 2002/0130727 | A1 * | 9/2002 | Nagasaka ...................... 332/103 |
| 2002/0193086 | A1 * | 12/2002 | Bauernschmitt et al. ..... 455/126 |
| 2006/0098758 | A1 * | 5/2006 | Luke et al. ..................... 375/297 |
| 2008/0137770 | A1 * | 6/2008 | Behzad et al. ................ 375/285 |
| 2009/0190647 | A1 | 7/2009 | Utsunomiya et al. |
| 2010/0093282 | A1 * | 4/2010 | Martikkala et al. .......... 455/63.4 |
| 2010/0164629 | A1 * | 7/2010 | Behzad et al. ................ 330/296 |
| 2011/0201287 | A1 * | 8/2011 | Pratt et al. ..................... 455/126 |
| 2012/0063495 | A1 * | 3/2012 | Behzad ......................... 375/219 |

FOREIGN PATENT DOCUMENTS

| WO | 2012/040737 A2 | 3/2012 |
| WO | 2012/040737 A3 | 6/2012 |

OTHER PUBLICATIONS

International Search report and Written Opinion received for PCT Patent Application No. PCT/US2011/053329, mailed on Mar. 27, 2012, 10 pages.
International Preliminary Report on Patentability and Written Opinion received for PCT Patent Application No. PCT/US2011/053329, mailed on Apr. 4, 2013, 7 pages.

* cited by examiner

Primary Examiner — Chieh M Fan
Assistant Examiner — Bahman Badipour
(74) Attorney, Agent, or Firm — Forefront IP Lawgroup, PLLC (57) ABSTRACT Attenuation is provided at the output of a power amplifier that provides transmitted signals or packets. The attenuation particularly provides separation of linear and non linear behavior of the signals. A reference packet is transmitted during attenuation. A normal packet is delivered without attenuation. Feedback from the reference packet can be extracted using the normal packet to calculate a loop-back response that is extracted and sent to a power amplifier pre-distortion correction algorithm.

6 Claims, 11 Drawing Sheets

CLOSE-LOOP POWER AMPLIFIER PRE-DISTORTION CORRECTION

BACKGROUND

For a wireless communication device, such as a broadband wireless communication device, calibration can be performed to assure that accurate radio frequency (RF) power is transmitted at an antenna and antenna connector of the wireless communication device. The calibration can be sensitive to the effects of impedance of the antenna connector. Such impedance can be referred to, or attributable to, voltage standing wave ratio (VSWR) effects.

As bandwidth frequencies increase for wireless communication devices, problems can arise as to providing accurate power and dealing with power amplifier non-linearity. In certain wireless communication device, power amplifier pre-distortion or PAPD algorithms can be performed to calibrate power amplifier (PA) non-linear response. This can be performed by extracting the AM and PM response of the PA. This response can be achieved from a loop-back that exists in the system after the PA output as measured by a detector. Sampled data after the PA may be multiplied by a detector frequency response, which occurs due to VSWR effects at an antenna port or connector. In certain cases the problem can be solved by using an equalizer to extract the original data; however, averaged data (i.e., sampled data) is of interest, and not on the original data itself.

In the case of PAPD for mask correction and limited VSWR, the PA can exhibit some "virtual" filter response before the PA that is translated into memory effects which current PAPD algorithms may not able to deal with. The memory effects are non linear in nature, and can be attributed to impedance change due to the antenna and interfaces (e.g., coupler/connector). From the non linearity and frequency change due to impedance, you get the memory effects. With greater or wider bandwidths, memory effects can become more pronounce in the PA. Therefore, it becomes more difficult to separate out the memory effects from an actual signal, as memory effects increase. Non linear scrambling and linear behavior of a channel formed by the PA are not easily separated.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Overview

For broadband channels of a wireless communication device, a goal is to accurately correct mask of a transmitted signal, and allow for the ability to track time behavior of the transmitted signal as implicated by the mask of the broadband transmitted signal. In particular implementations, additional hardware can be provided to split the output of the PA behavior. In particular separation of non-linear behavior and linear behavior of the PA is performed through attenuation. The following techniques provide for the use of available PAPD algorithms to correct error vector magnitude (EVM) and mask of a transmitted signal of a wireless communication device, considering VSWR at an antenna.

Example Wireless Communication Device

Figure 1:
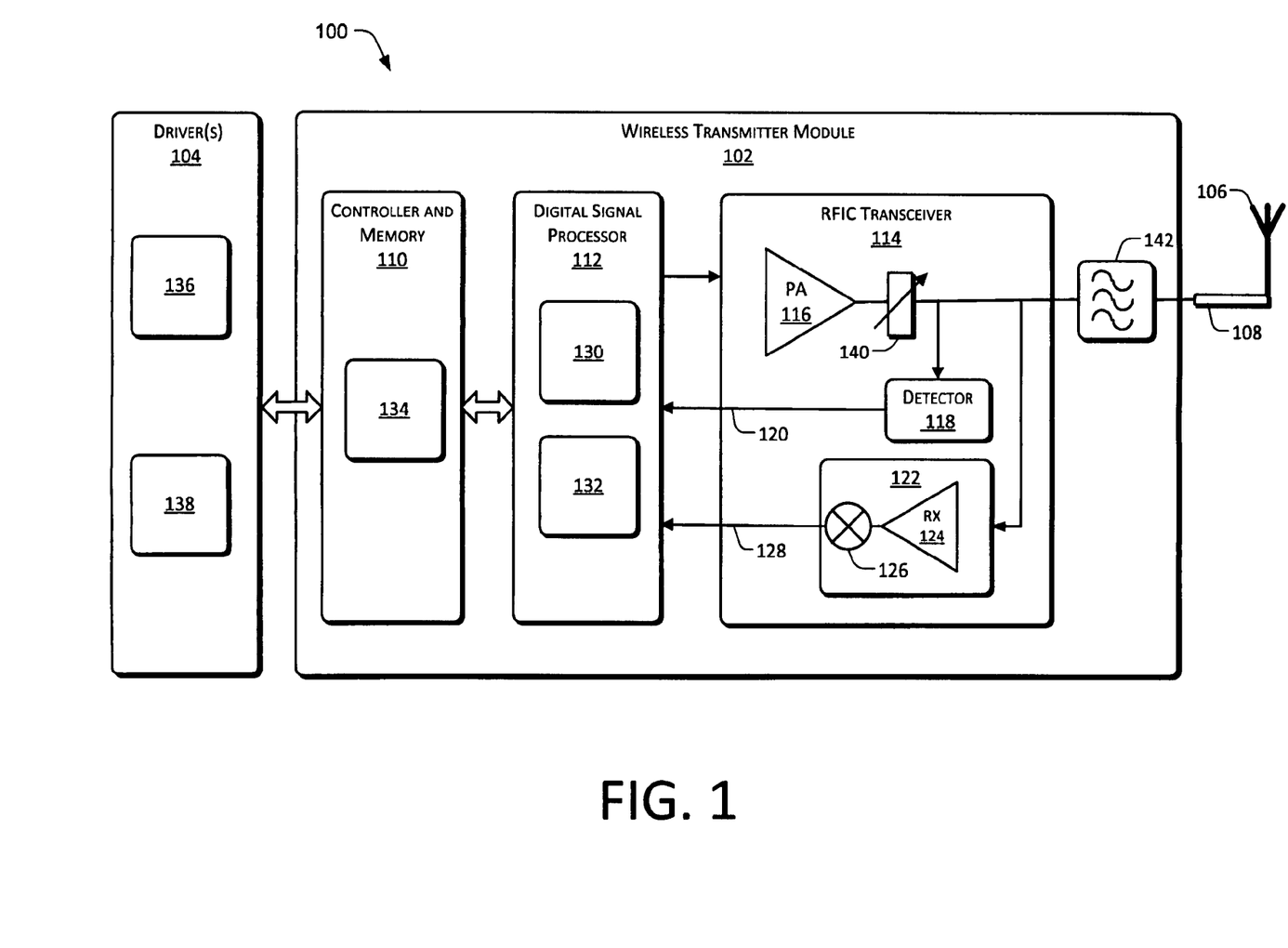
FIG. 1 is a block diagram of an example wireless communication device according to some implementations.

FIG. 1 shows an example wireless communication device 100. The wireless communication device 100 uses a close-loop calibration algorithm procedure to assure accurate power transmission.

The wireless communication device 100 can include broadband devices, such as laptops, net books, personal digital assistants (PDAs), e-readers, smart phones, etc. It is also contemplated that wireless communication device 100 can include voice only devices, such as cellular telephones.

In this implementation, the wireless communication device 100 includes a wireless transmitter module 102, and driver(s) 104. In certain cases, the wireless transmitter module 102 can be implemented in hardware, for example as part of an integrated circuit in silicon. The driver(s) 104 in certain cases can be implemented in software and/or firmware. The wireless device includes one or more antenna(e) 106 to receive and transmit RF powered signals. Lines, cables and/or ports, as represented by connector 108, connect wireless transmitter module 102 with antenna(e) 106. Measurements can be taken at antenna(e) 106 for power output.

The wireless communication device 100 can further include one or more processor(s) (not shown) and memory (not shown), configured to communicate with and process the procedures of the described components of wireless communication device 100. In certain cases, driver(s) 104 can be implemented as part of the memory. The memory can include computer readable storage media configured to perform the described methods.

The wireless transmitter module 102 can include a dedicated internal controller and memory 110, a digital signal processor (DSP) 112, and a radio frequency integrated circuit (RFIC) transceiver 114. The controller and memory 110 can include computer readable storage media. The RFIC transceiver 114 includes a power amplifier or PA 116 and detector 118. The PA 116 provides a signal sent to antenna(e) 106. The impedance seen by the PA 116 at the output, adds a response to the signal/channel which is modeled as a filter at the PA 116 input and the PA 116 output.

The detector 118 reads the power at power amplifier 116, and provides a signal on line 120 to DSP 112. The RFIC transceiver 114 includes a loop-back chain 122. The loop-back chain 122 receives an output from the power amplifier 116 through a receiver 124. The receiver 124 can amplify the received signal. A mixer 126 is included in the loop-back chain 122. A loop-back response signal is provided at line 128. In particular, the loop-back chain 122 is used along with a transmitted OFDM packet, as described below, to determine or learn a linear response at the detector 118 (i.e., output of the power amplifier 116). The linear response can be determined by subtracting the transmitted OFDM packet from the actual measurement at the detector 118.

In this implementation, DSP 112 includes a module 130 that transmits reference packets. The reference packets is transmitted in attenuation mode. The transmitted reference packets can be OFDM packets. In this example, the DSP 112 includes a module 132 that transmits packets in normal mode, i.e., expected transmitted packets.

The internal controller and memory 110 can include particular modules to process and/or pass on data. In this example, a module 132 is configured to control data transfer to and from the DSP 112 and the RFIC transceiver 114, and the driver(s) 104. In this example, the driver(s) 104 includes a module 136 configured to extract the loop-back response (i.e., signal on line 128) and equalize received packets. The driver(s) 104 include a module 138 configured to deliver an extracted packet to a PAPD algorithm.

Data can be looped back to driver(s) 104 by way of loop back chain 122, module 132 and module 134. Once the PAPD algorithm is processed/completed, any data/tables can be stored in controller memory 110 and processed by DSP 112.

In this implementation, a controlled attenuator 140 is configured to control attenuation of the output of PA 116, as further described below. Attenuated output can be further processed by one or more filter(s) 142.

Figure 2:
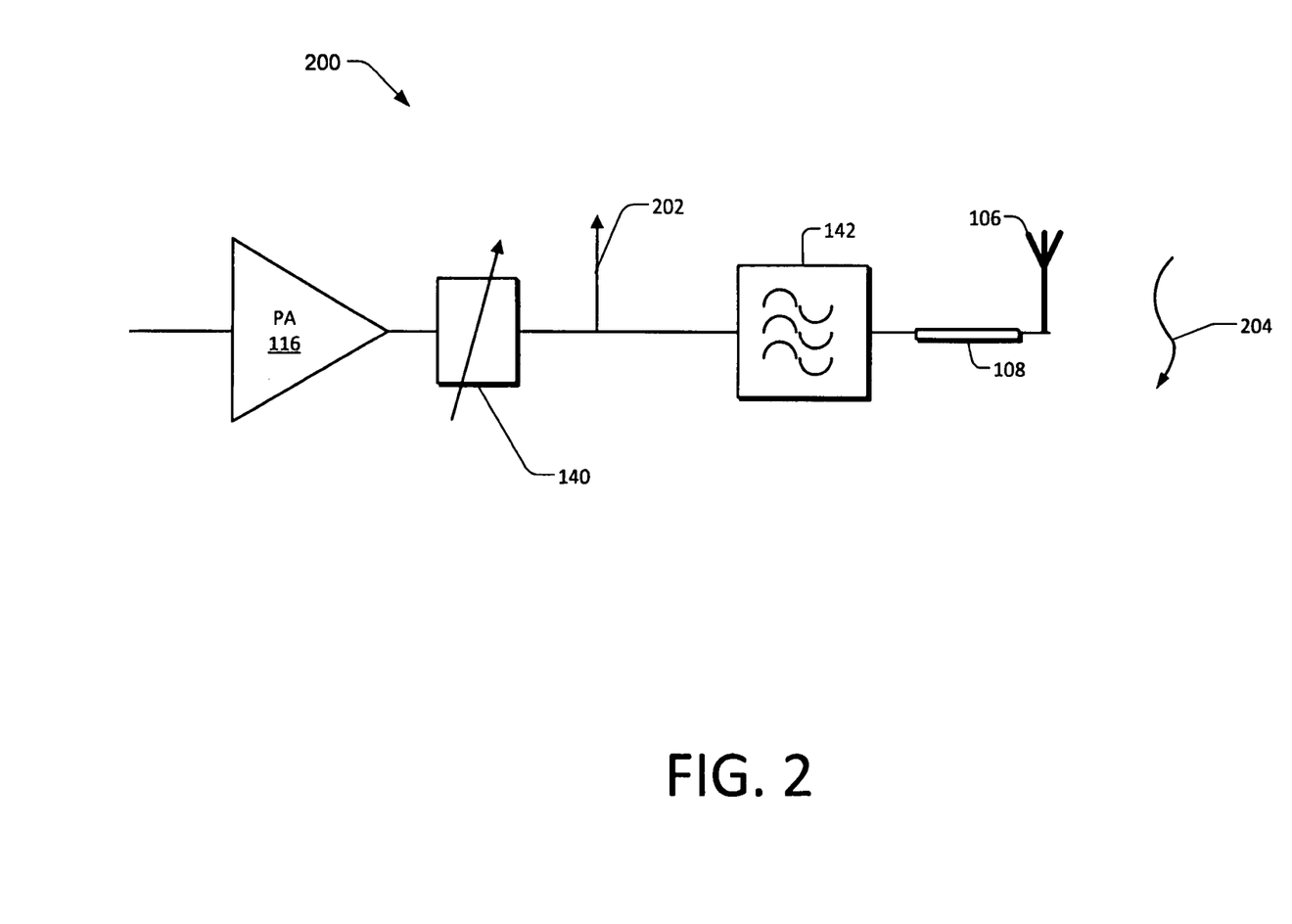
FIG. 2 is a block diagram of an example system using one transmission to calibrate coupler point response according to some implementations.

FIG. 2 shows an example system 200 using one transmission to calibrate coupler point response. The system 200 is part of the wireless communication device 100, and includes the PA 116, the controlled attenuator 140, the filter(s) 142, connector or coupler 108, and antenna(e) 106. An attenuated signal is provided at line 202 which is sent to loop-back chain 122. Actual transmitted signal is represented by signal 204.

In order to get the correct coupler frequency response, a transmitter is implemented that is not affected by VSWR change in the desired frequency range. This can be achieved by adding attenuation. In this example, attenuation is added to the RFIC transceiver by system 200. The use of such attenuation can be for calibration only. Therefore, such implementation of attenuation is acceptable, as long as the main transmit mode is minimally affected. In such an attenuation mode, the PA 116 itself does not see antenna reflections. Therefore, it is possible to achieve a reading at the coupler or connector 108 of the filter response, only after the PA 116, which is the desired coupler or connector 118 response.

In summary, the control attenuator 140 is before the coupling point or connector 108 and after the PA 116. In regular transmit mode, the control attenuator 140 is not used, but is used in calibration mode. Step attenuation can be added during calibration mode, providing the PA 116 with a defined interface/channel with no memory effects. Channel response before the PA 116 that causes the memory effects disappears when there is no VSWR change at the output of the PA 116. Therefore, only the linear channel behavior is observed, and there is a split between the PA 116 and the interface or connector 108.

Example Graphs

Figure 3:
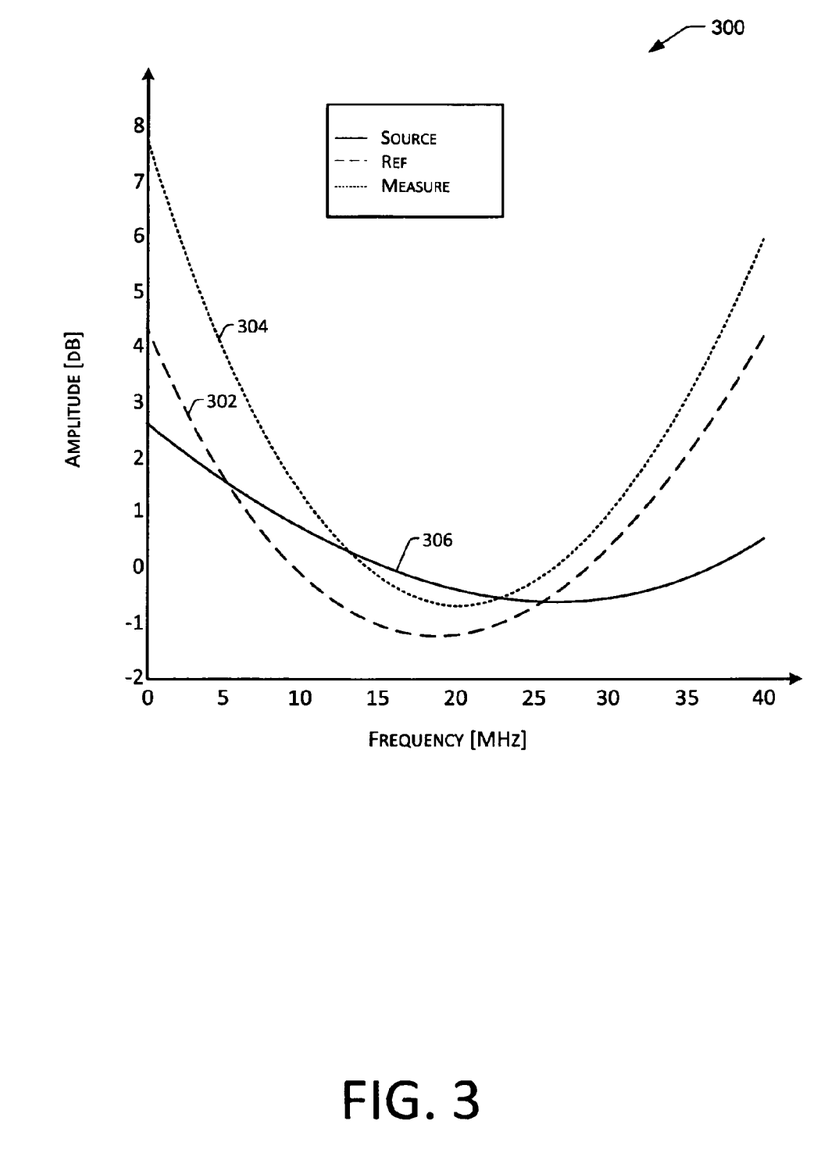
FIG. 3 is an example graph that can be achieved that shows amplitude response according to some implementations.

FIG. 3 shows an example graph 300 that can be achieved that shows amplitude response. For example, a 40 Mhz packet can be transmitted and measured at the output (i.e., antenna(e) 106) and at the coupling point (i.e., connector 108) under relatively strong VSWR change. Measurement can also be performed at the coupling point (i.e., connector 108) with lower power and some attenuation after the PA 116. Based on the packet the amplitude and phase response over frequency can be extracted and plotted.

Graph 300 shows an example amplitude response that can be measured. The line 302 represents the response at the coupler (i.e., connector 108) when attenuation is on. The line 304 is the measurement at the coupler (i.e., connector 108) under normal operation and the line 306 represents the actual transmitted packet as measured at antenna(e) 106 output. It can be seen that the actual packet has some response that can become more significant after the coupler sampling.

Figure 4:
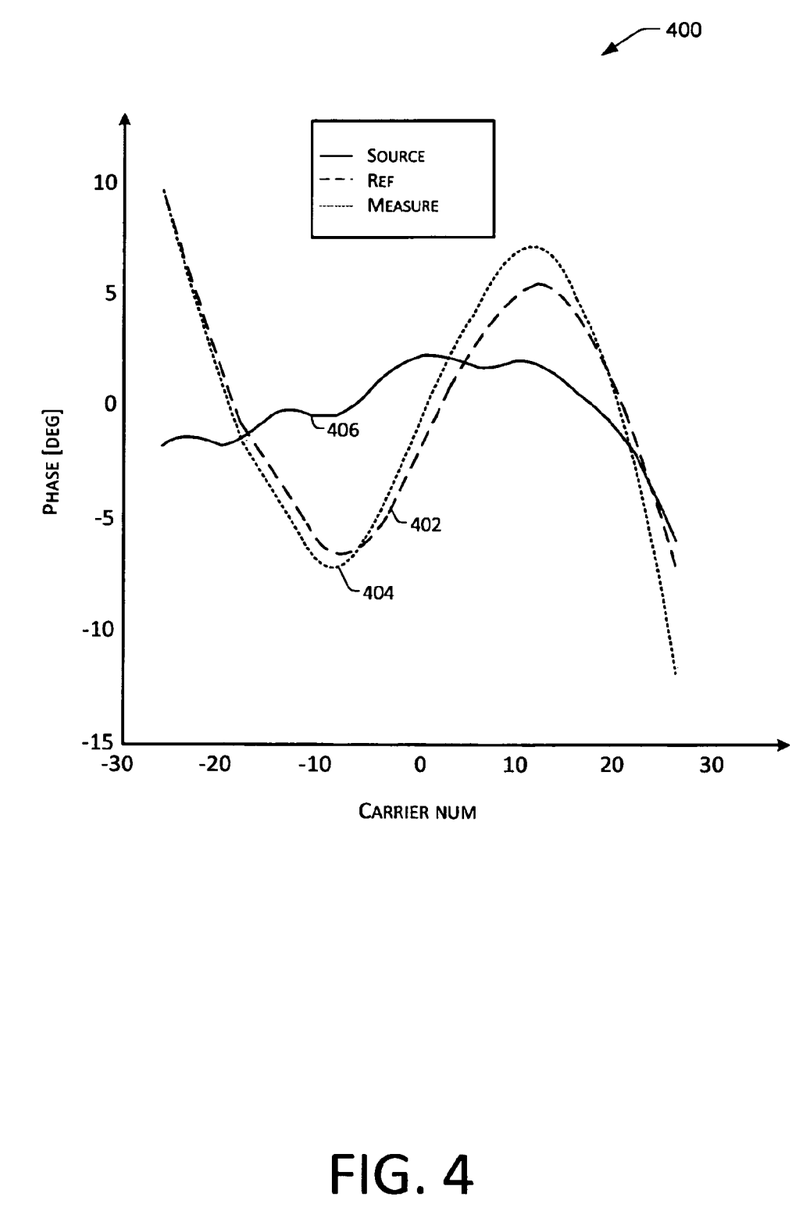
FIG. 4 is an example graph that can be achieved that shows phase response according to some implementations.

FIG. 4 shows an example graph 400 that can be achieved that shows phase response. The line 402 represents the response at the coupler (i.e., connector 108) when attenuation is on. The line 404 is the measurement at the coupler (i.e., connector 108) under normal operation and the line 406 represents the actual transmitted packet as measured at antenna (e) 106 output. Similar to graph 300, graph 400 shows that the actual packet has some response that can become more significant after the coupler sampling.

Figure 5:
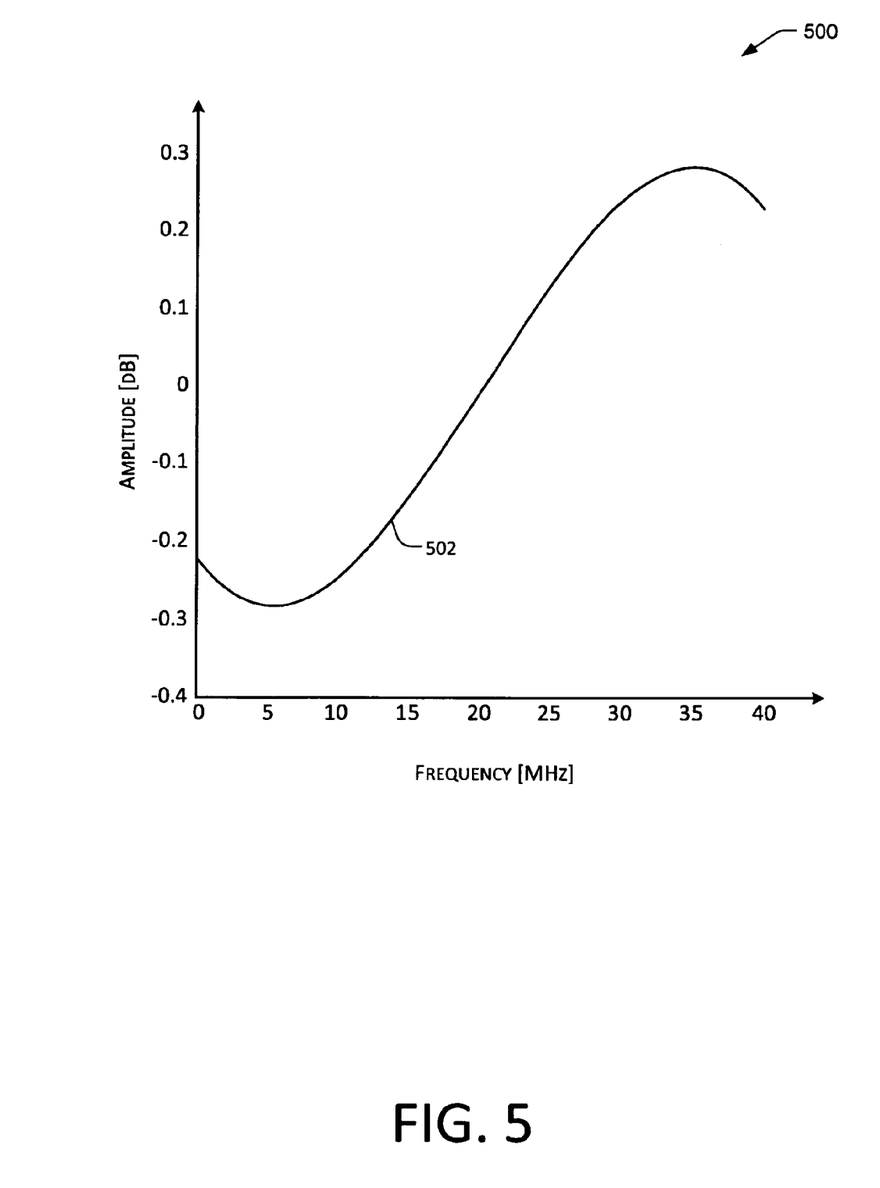
FIG. 5 is an example graph that can be achieved that shows amplitude error of a transmitted packet or signal after extracting loop-back frequency response according to some implementations.

FIG. 5 shows an example graph 500 that can be achieved that shows amplitude error of a transmitted packet or signal after extracting loop-back frequency response. In particular, the line 502 represents amplitude error of a packet after extracting loop-back frequency response. The loop-back frequency response is attributable to the channel created after the PA 116. For loop-back frequency response measurement, the effects of the channel are removed. By adding attenuation at the output of the PA 116, and performing a separation between the input of the interface (i.e., connector 108) and input of the PA 116, behavior can be extracted at the interface or connector 108 of the antenna(e) 106. Once such behavior is extracted, other PAPD correction algorithms or procedures can be performed. Therefore, controlled attenuation is provided. Example values of such controlled attenuation are about 5 to 6 dB of the received/transmitted signal. The controlled attenuator 140 should provide a signal back to the PA 116 that is not affected by other devices or interfaces that follow the PA 116.

Figure 6:
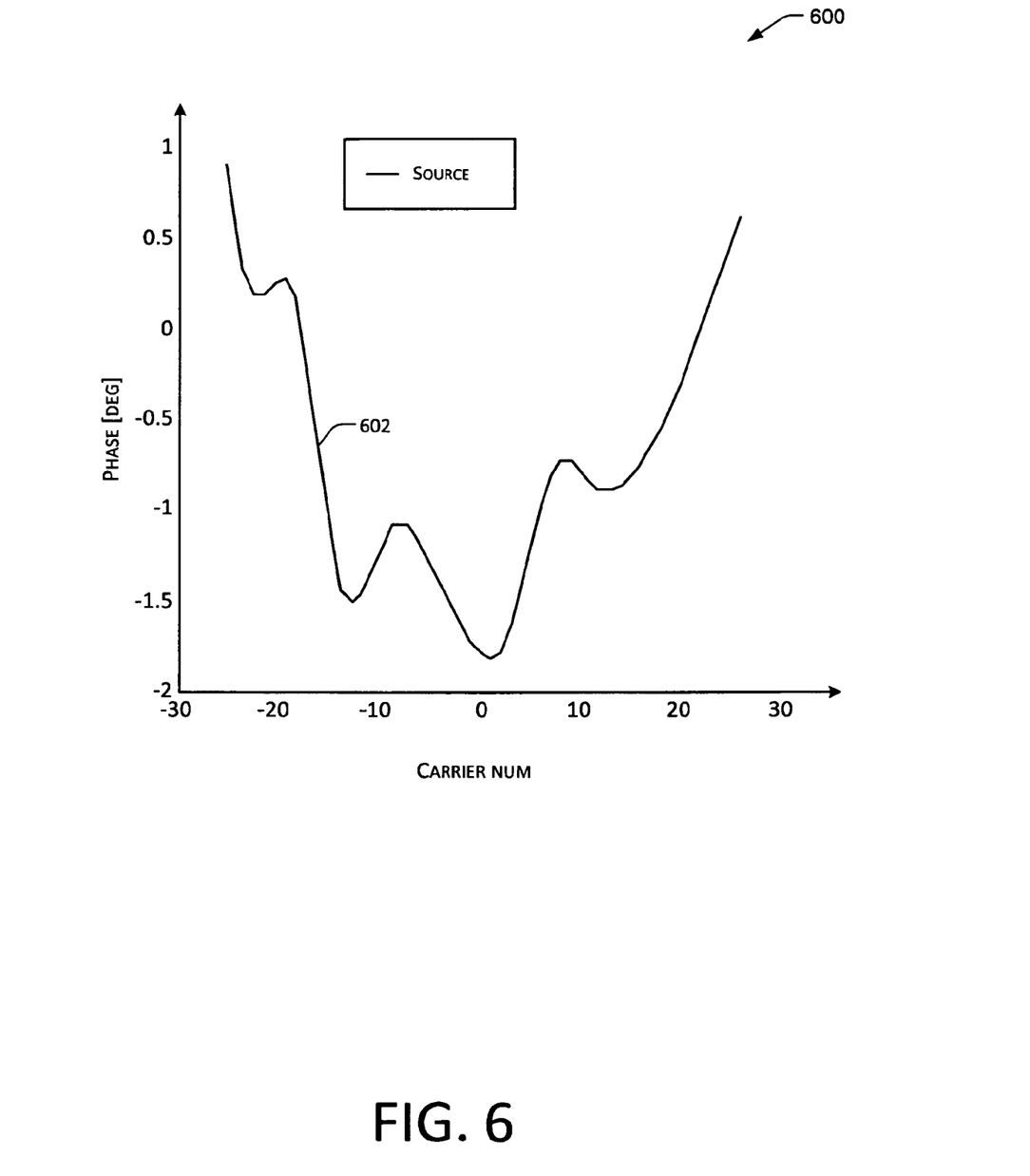
FIG. 6 is an example graph that can be achieved that shows phase error of a transmitted packet or signal after extracting loop-back frequency response according to some implementations.

FIG. 6 shows an example graph 600 that can be achieved that shows phase error of a transmitted packet or signal after extracting loop-back frequency response. In particular, the line 602 represents phase error of a packet after extracting loop-back frequency response.

From example of graphs 500 and 600, it can be seen that error between actual transmission signal and a calculated value is limited by +/−0.3 dB and +/−1.5 deg. Such tolerance is sufficient for typical PAPD correction algorithms. Therefore, loop-back response at the coupler or connector 108 can be eliminated and actual transmitted data can be achieved.

Attenuation Examples

Various implementations can be provided for attenuation for use as described above. In the described implementations, the addition of transistors, resistors, and other devices can be implemented. The following illustrated particular examples; however, it is to be understood that other implementations can be used.

Figure 7:
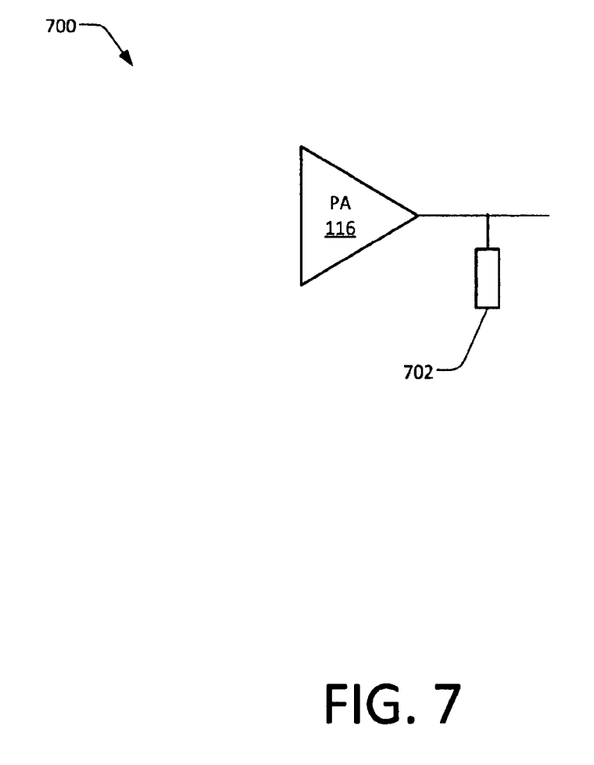
FIG. 7 is a block diagram of an example system that includes parallel attenuation according to some implementations.

FIG. 7 shows an example system 700 that includes parallel attenuation 702. This can be a general implementation providing parallel attenuation 702 during calibration. The parallel attenuation 702 can be an implementation of controlled attenuator 140. Parallel attenuation has the advantage of minimal impact on the transmit or TX signal when the attenuation is off.

Figure 8:
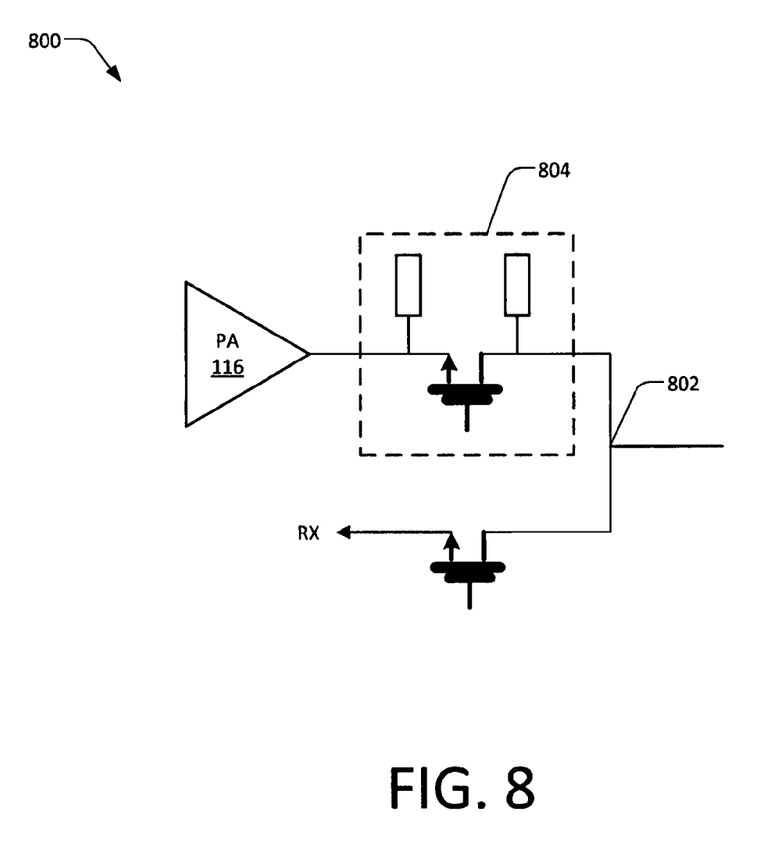
FIG. 8 is a block diagram of an example system that includes a transmit/receive switch with embedded attenuation according to some implementations.

FIG. 8 shows an example system 800 that includes a transmit/receive (T/R) switch 802. The T/R switch 802 can be a preexisting device of wireless communication device 100. In other words, the T/R switch 802 can provide another function that is different than attenuation during calibration as described above. In particular, attenuation 804, can be embedded in T/R switch 802. Since the attenuator or attenuation 802 is embedded in the switch 802, the additional insertion loss is minimal.

Figure 9:
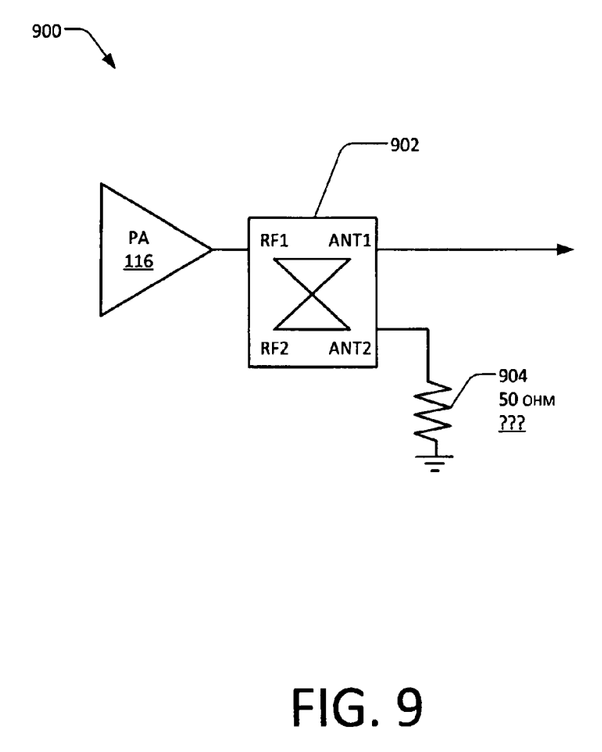
FIG. 9 is a block diagram of an example system that includes a transmit/receive switch with terminated resistor according to some implementations.

FIG. 9 shows an example system 900 that includes a transmit/receive (T/R) switch 902. The T/R switch 902 can be a preexisting device of wireless communication device 100. In this example, a resistor 904 is provided. An example value of resistor 904 is 50 ohm. In implementations, such as system 800 and system 900, where a transmit/receive preexists, parallel terminations can be added. The additions are parallel to the main signal, such that the total loss to the main channel can be minimal. Example losses can be 0.1 dB to 0.2 dB. Any additional switches can be relatively small, since a relatively low power is delivered through the channel.

Figure 10:
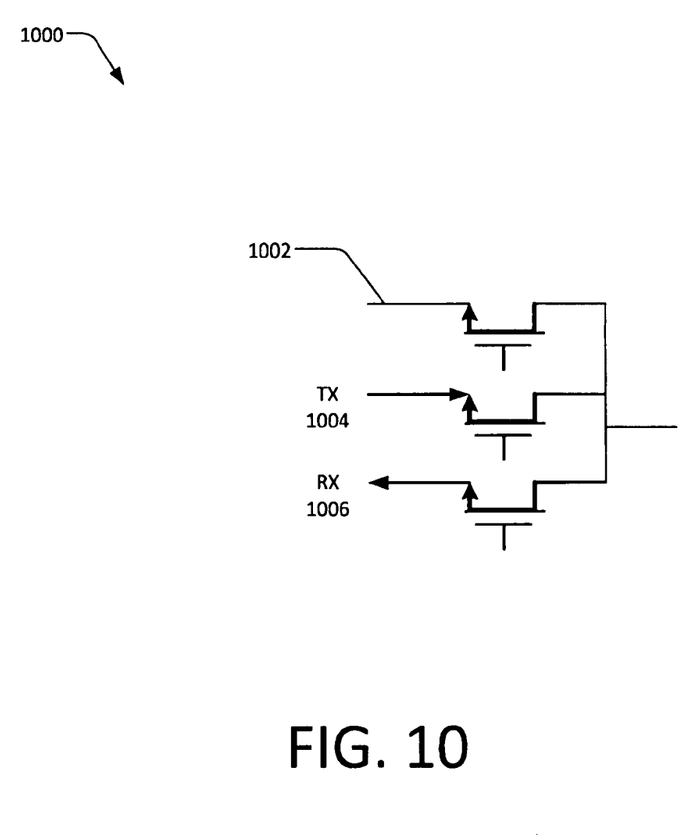
FIG. 10 is a block diagram of an example system that includes a reference channel for calibration according to some implementations.

FIG. 10 shows an example system 1000 that includes a reference channel for calibration 1002. In this implementation a transmit switch TX 1004 is provided along with a receive switch RX 1006. The transmit switch 1004 and receive switch 1006 can be preexisting switches of wireless communication device 100, and the reference channel for calibration 1002 can be added. The reference channel for calibration 1002 is implemented during calibration of the wireless communication device 100.

Example Process

Figure 11:
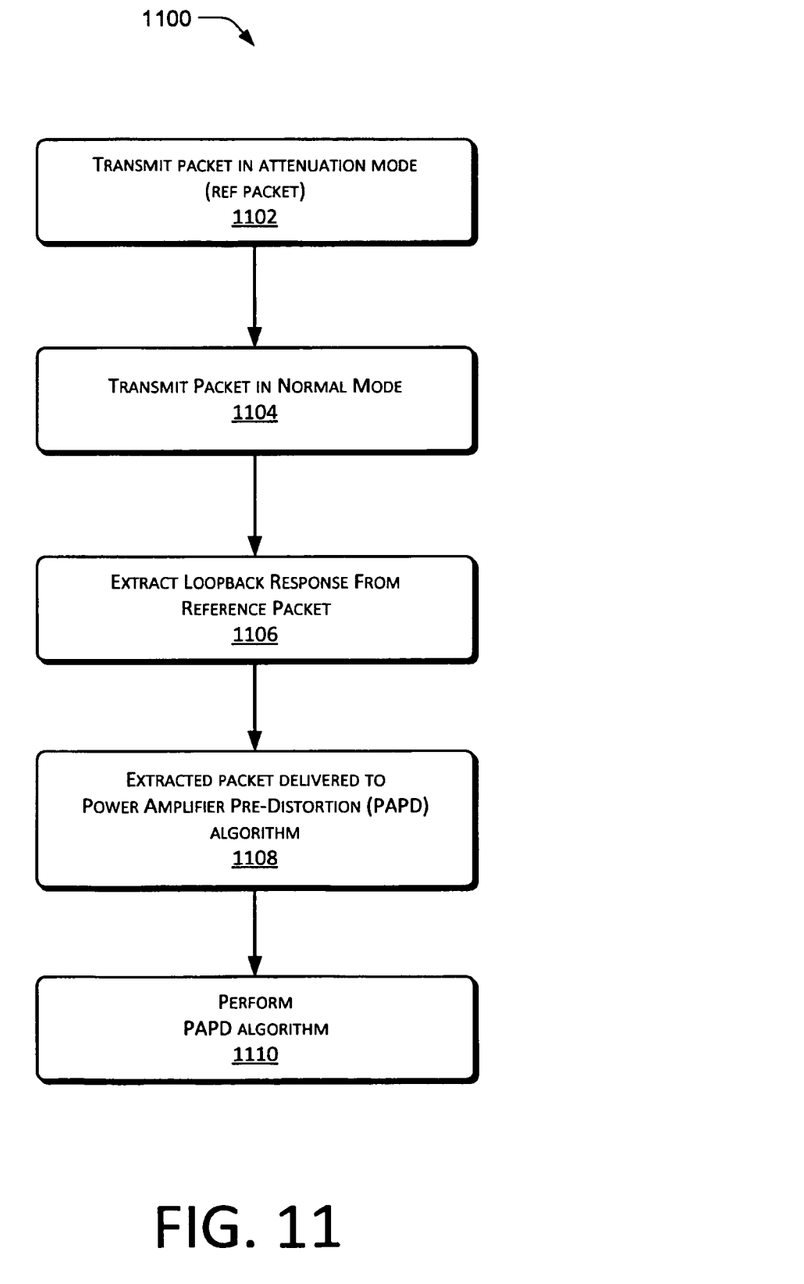
FIG. 11 is a flow chart for performing a calibration loop-back frequency response extraction according to some implementations.

FIG. 11 shows a flow chart for an exemplary process 1100 for performing a calibration flow for loop-back frequency response extraction for a wireless communication device. The order in which the method is described is not intended to be construed as a limitation, and any number of the described method blocks can be combined in any order to implement the method, or alternate method. Additionally, individual blocks can be deleted from the method without departing from the spirit and scope of the subject matter described herein. Furthermore, the method can be implemented in any suitable hardware, software, firmware, or a combination thereof, without departing from the scope of the invention.

At block 1102, a reference packet is transmitted. The reference packet is transmitted in attenuation mode. In other words, attenuators are provided such that for loop-back frequency response measurement, the effects of the channel are removed for the reference packet. As described above, attenuation can be provided at the output of the power amplifier that provides the signal. A separation can be performed between the input of an antenna or output interface/connector and input of the power amplifier, such that behavior can be extracted at the interface/connector.

At block 1104, a packet is transmitted in normal mode. Normal mode is expected transmission without attenuation. The transmitted packet includes non linear and linear behavior.

At block 1106, the loop-back response of the reference packet is extracted. In particular, the reference packet is divided by the packet transmitted in normal mode, in order to extract the response of the channel that is created by the power amplifier. In an implementation, driver(s) 104 can perform loop-back response of the reference packet or extraction of the linear channel.

At block 1108, the extracted packet is delivered and can be used by existing power amplifier pre-distortion algorithm processes (i.e., PAPD algorithm).

At block 1110, the PAPD algorithm can be performed. The PAPD algorithm processes can be used to correct error vector magnitude and mask of the transmitted signal and taking into account VSWR changes. In an implementation, driver(s) 104 can perform the PAPD algorithm process or packet correction.

Conclusion

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as communication devices, computing devices, and other electronic devices.

What is claimed is:

1. A wireless communication system comprising:
a power amplifier;
an antenna;
a coupler connecting the power amplifier to the antenna;
one or more attenuators that are configured to facilitate calibration of the power amplifier, the one or more attenuators are configured to provide a reference packet or an expected transmitted packet to the coupler during an attenuation mode or a normal mode, respectively; and
a driver that is configured to extract a loop-back response based from the reference packet and the expected transmitted packet, wherein the loop-back response represents a channel behavior after the power amplifier, and wherein the driver is configured to perform a power amplifier pre-distortion (PAPD) algorithm based from the channel behavior.

2. The wireless communication system of claim 1, wherein the loop-back response is derived by dividing the reference packet by the expected transmitted packet.

3. The wireless communication system of claim 1, wherein the one or more attenuators are configured to perform parallel attenuation.

4. The wireless communication system of claim 1, wherein the one or more attenuators are configured to perform a step attenuation.

5. The wireless communication system of claim 1, wherein the one or more attenuators are implemented during calibration mode of the wireless communication device.

6. The wireless communication system of claim 1 further comprising a digital signal processor to process an output of the PAPD algorithm.

* * * * *